(12) United States Patent
Noto

(10) Patent No.: US 11,201,587 B2
(45) Date of Patent: Dec. 14, 2021

(54) PIEZOELECTRIC OSCILLATOR AND PIEZOELECTRIC OSCILLATION DEVICE

(71) Applicant: Murata Manufacturing Co., Ltd., Nagaokakyo (JP)

(72) Inventor: Kazuyuki Noto, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 909 days.

(21) Appl. No.: 15/958,072

(22) Filed: Apr. 20, 2018

(65) Prior Publication Data

US 2018/0248516 A1  Aug. 30, 2018

Related U.S. Application Data

(63) Continuation of application No. PCT/JP2016/073528, filed on Aug. 10, 2016.

(30) Foreign Application Priority Data

Nov. 5, 2015 (JP) .............................. JP2015-217936

(51) Int. Cl.
   *H03B 5/32* (2006.01)
   *H03H 9/19* (2006.01)
   (Continued)

(52) U.S. Cl.
   CPC ............... *H03B 5/32* (2013.01); *H03B 5/04* (2013.01); *H03H 9/02102* (2013.01);
   (Continued)

(58) Field of Classification Search
   CPC ... H03B 5/32; H03B 5/04; H03H 9/19; H03H 9/1021; H03H 9/02102; H03H 9/0552;
   (Continued)

(56) References Cited

U.S. PATENT DOCUMENTS 9,287,882 B2  3/2016 Yokoo
9,503,099 B2  11/2016 Yokoo
(Continued)

FOREIGN PATENT DOCUMENTS

CN  102684602 A  9/2012
CN  104639041 A  5/2015
(Continued)

OTHER PUBLICATIONS

International Search Report issued in International Application No. PCT/JP2016/073528, dated Nov. 1, 2016.
(Continued)

*Primary Examiner* — Jeffrey M Shin
(74) *Attorney, Agent, or Firm* — Arent Fox LLP

(57) ABSTRACT

A piezoelectric oscillator includes a base member; a piezoelectric resonator mounted on an upper surface of the base member; a lid member joined to the upper surface so as to hermetically seal the piezoelectric resonator; an electronic component mounted on a lower surface of the base member; a mounting frame joined to the lower surface so as to surround the electronic component; and a heat conduction path disposed on the base member and/or the mounting frame. The heat conduction path is electrically isolated from both of the piezoelectric resonator and the electronic component in the piezoelectric oscillator and has heat conductivity. The heat conduction path includes a first heat conduction portion inside where the base member and the mounting frame overlap, and a second heat conduction portion connected to the first heat conduction portion and disposed outside where the base member and the mounting frame overlap.

18 Claims, 7 Drawing Sheets

(51) Int. Cl.
*H03H 9/10* (2006.01)
*H03H 9/02* (2006.01)
*H03H 9/05* (2006.01)
*H03B 5/04* (2006.01)

(52) U.S. Cl.
CPC ........ *H03H 9/0538* (2013.01); *H03H 9/0552* (2013.01); *H03H 9/1021* (2013.01); *H03H 9/19* (2013.01); *H01L 2224/16225* (2013.01); *H01L 2924/16152* (2013.01)

(58) Field of Classification Search
CPC ........ H03H 9/0538; H01L 2224/16225; H01L 2924/16152
See application file for complete search history.

(56) References Cited

U.S. PATENT DOCUMENTS

| | | |
|---|---|---|
| 2012/0229225 A1 | 9/2012 | Horie |
| 2013/0257555 A1 | 10/2013 | Horie |
| 2014/0125420 A1 | 5/2014 | Horie |
| 2014/0239773 A1 | 8/2014 | Horie |
| 2015/0123737 A1* | 5/2015 | Yokoo ..................... H03B 5/32 331/34 |
| 2016/0079986 A1 | 3/2016 | Yokoo et al. |
| 2017/0264214 A1 | 9/2017 | Horie |

FOREIGN PATENT DOCUMENTS

| | | |
|---|---|---|
| JP | 2007116628 A | 5/2007 |
| JP | 2007157784 A | 6/2007 |
| JP | 2010135995 A | 6/2010 |
| JP | 2014150453 A | 8/2014 |
| JP | 2015091128 A | 5/2015 |
| JP | 2015228555 A | 12/2015 |
| WO | 2015045906 A1 | 4/2015 |

OTHER PUBLICATIONS

Written Opinion of the International Searching Authority issued in International Application No. PCT/JP2016/073528, dated Nov. 1, 2016.

* cited by examiner

PIEZOELECTRIC OSCILLATOR AND PIEZOELECTRIC OSCILLATION DEVICE

CROSS REFERENCE TO RELATED APPLICATIONS

The present application is a continuation of PCT/JP2016/073528 filed Aug. 10, 2016, which claims priority to Japanese Patent Application No. 2015-217936, filed Nov. 5, 2015, the entire contents of each of which are incorporated herein by reference.

TECHNICAL FIELD

The present disclosure relates to a piezoelectric oscillator and a piezoelectric oscillation device.

BACKGROUND

Patent Document 1 (identified below) describes, as a type of piezoelectric oscillation device, a quartz crystal oscillator in which a quartz crystal element is disposed on an upper surface of a substrate, an electronic component (such as an integrated circuit element) is formed on a lower surface of the substrate, and the integrated circuit element is surrounded by a mounting frame. The quartz crystal oscillator is mounted on a circuit board in such a way that the mounting frame faces the circuit board.

Patent Document 1: Japanese Unexamined Patent Application Publication No. 2015-91128.

With such an existing structure as shown in Patent Document 1, because the integrated circuit element is disposed on the circuit board in a space surrounded by the mounting frame, heat that is generated by the integrated circuit element may not be easily released to the outside of the oscillator. Thus, heat of the integrated circuit element is transferred to the quartz crystal element via the substrate and generates a temperature difference between the quartz crystal element and the integrated circuit element. The temperature difference may hinder the integrated circuit element from performing adjustment of temperature control and adjustment of frequency variation of the quartz crystal element.

SUMMARY OF THE INVENTION

The exemplary embodiments of the present disclosure have been made in consideration of the above circumstances. Thus, it is an object thereof to provide a piezoelectric oscillator and a piezoelectric oscillation device that can easily and effectively dissipate heat that is generated by an electronic component.

Accordingly, a piezoelectric oscillator is disclosed according to an exemplary aspect of the present disclosure that includes a base member that has an upper surface and a lower surface; a piezoelectric resonator that is mounted on the upper surface of the base member; a lid member that is joined to the upper surface of the base member so as to hermetically seal the piezoelectric resonator; an electronic component that is mounted on the lower surface of the base member; a mounting frame that is joined to the lower surface of the base member so as to surround the electronic component; and a heat conduction path that is formed on at least one of the base member and the mounting frame. Moreover, the heat conduction path is electrically isolated from both of the piezoelectric resonator and the electronic component in the piezoelectric oscillator, and is configured to conduct heat. The heat conduction path includes a first heat conduction portion that is disposed inside of a portion where the base member and the mounting frame overlap each other, and a second heat conduction portion that is connected to the first heat conduction portion and that is disposed outside of the portion where the base member and the mounting frame overlap each other.

With the structure described above, the first heat conduction portion, which is disposed in a space in which the electronic component is disposed, can absorb heat from the electronic component, and the second heat conduction portion can dissipate the heat to the outside. Therefore, heat that is generated by the electronic component can be easily and effectively dissipated to the outside.

A piezoelectric oscillator according to another exemplary aspect of the present disclosure includes a base member that has an upper surface and a lower surface; a piezoelectric resonator that is mounted on the upper surface of the base member; a lid member that is joined to the upper surface of the base member so as to hermetically seal the piezoelectric resonator; an electronic component that is mounted on the lower surface of the base member, a mounting frame that is joined to the lower surface of the base member so as to surround the electronic component; and a heat conduction path that is formed on at least one of the base member and the mounting frame. In this aspect, the heat conduction path is electrically isolated from both of the piezoelectric resonator and the electronic component in the piezoelectric oscillator, and configured to conduct heat. A gap is formed between the lower surface of the base member and a surface of the mounting frame facing the base member. The heat conduction path includes a first heat conduction portion that is disposed in the gap, and a second heat conduction portion that is connected to the first heat conduction portion and that is disposed outside of the portion where the base member and the mounting frame overlap each other.

With the structure described above, the first heat conduction portion, which is disposed in the gap that is connected to the space in which the electronic component is disposed, can absorb heat from the electronic component, and the second heat conduction portion can dissipate the heat to the outside. Therefore, heat that is generated by the electronic component can be easily and effectively dissipated to the outside.

A piezoelectric oscillation device according to yet another aspect of the present disclosure includes a piezoelectric oscillator including a base member that has an upper surface and a lower surface, a piezoelectric resonator that is mounted on the upper surface of the base member, a lid member that is joined to the upper surface of the base member so as to hermetically seal the piezoelectric resonator, an electronic component that is mounted on the lower surface of the base member, and a mounting frame that is joined to the lower surface of the base member so as to surround the electronic component. Moreover, a circuit board is provided on which the piezoelectric oscillator is mounted in such a way that the mounting frame faces the circuit board; and a heat conduction path that is formed on at least one of the base member, the mounting frame, and the circuit board. The heat conduction path is electrically isolated from both of the piezoelectric resonator and the electronic component in the piezoelectric oscillator, and configured to conduct heat. The heat conduction path includes a first heat conduction portion that is disposed inside of a portion where the base member and the mounting frame overlap each other, and a second heat conduction portion that is connected to the first heat conduction portion and that is disposed outside of the portion where the base member and the mounting frame overlap each other.

With the structure described above, the first heat conduction portion, which is disposed in the space in which the electronic component is disposed, can absorb heat from the electronic component, and the second heat conduction portion can dissipate the heat to the outside. Therefore, heat that is generated by the electronic component can be easily and effectively dissipated to the outside.

With the exemplary aspects of the present invention, a piezoelectric oscillator and a piezoelectric oscillation device are provided that can easily and effectively dissipate heat to the outside that is generated by an electronic component.

DETAILED DESCRIPTION OF EXEMPLARY EMBODIMENTS

Figure 1:
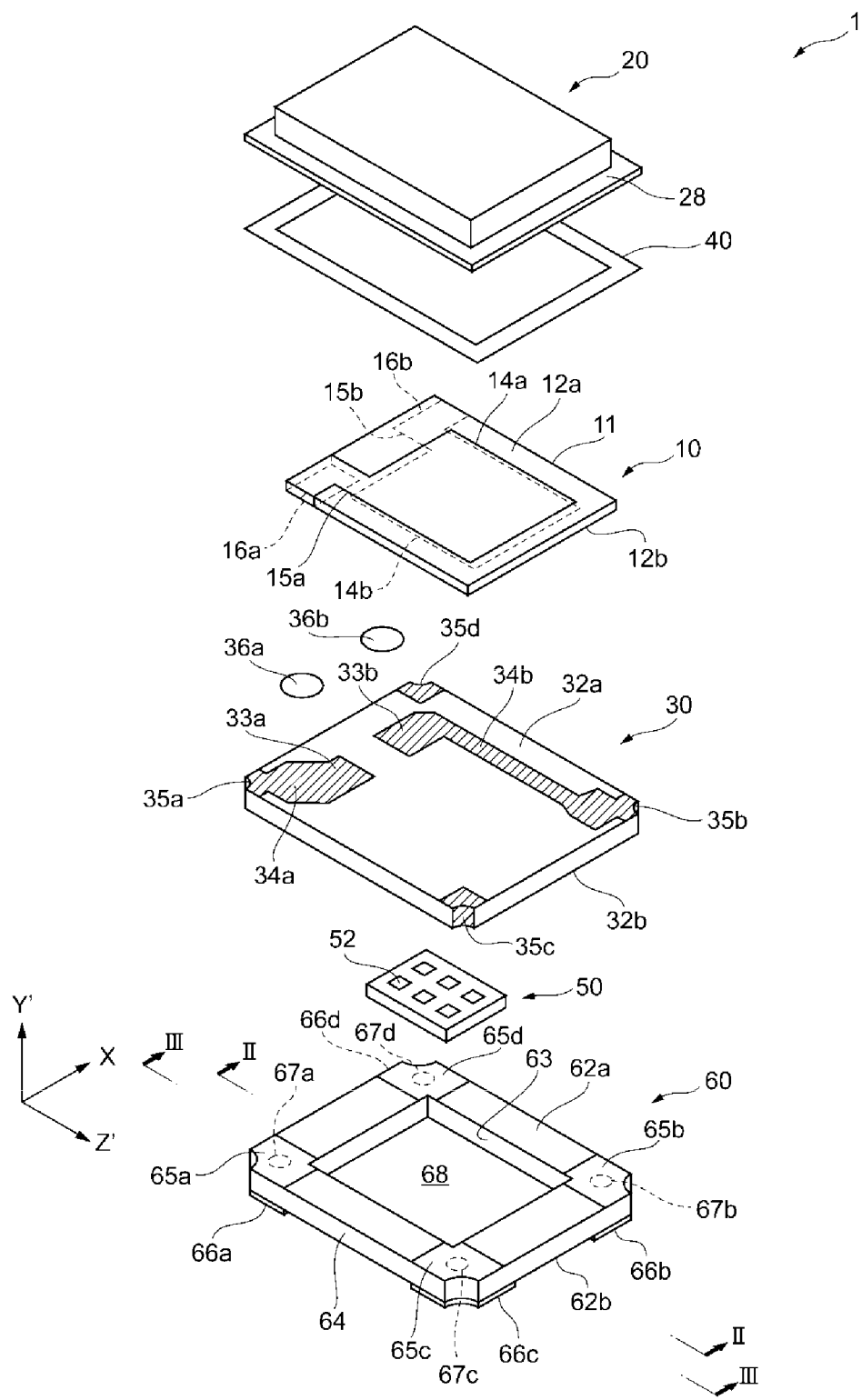
FIG. 1 is an exploded perspective view of a piezoelectric oscillator according to an exemplary embodiment.

Hereinafter, exemplary embodiments of the present disclosure will be described. In the drawings used in the following description, elements that are the same as or similar to each other are denoted by the same or similar numerals. The drawings show examples, and the dimensions and shapes of elements in the drawings are schematic. It should be noted that the technical scope of the exemplary aspects of the present invention is not limited to the embodiments described below.

Figure 2:
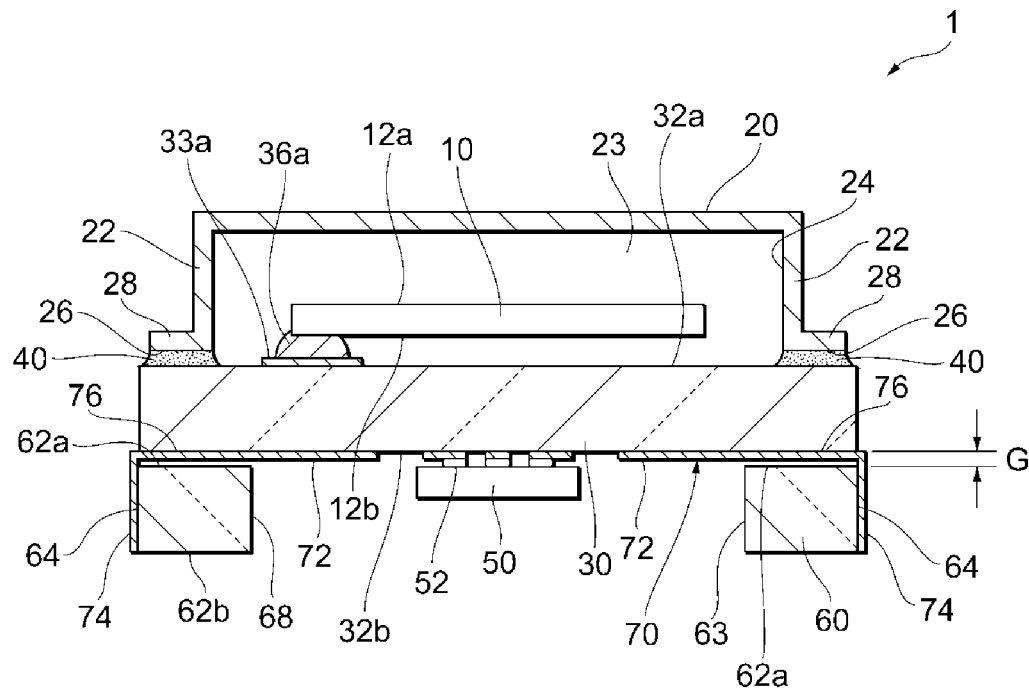
FIG. 2 is a sectional view taken along line II-II of FIG. 1.
Figure 3:
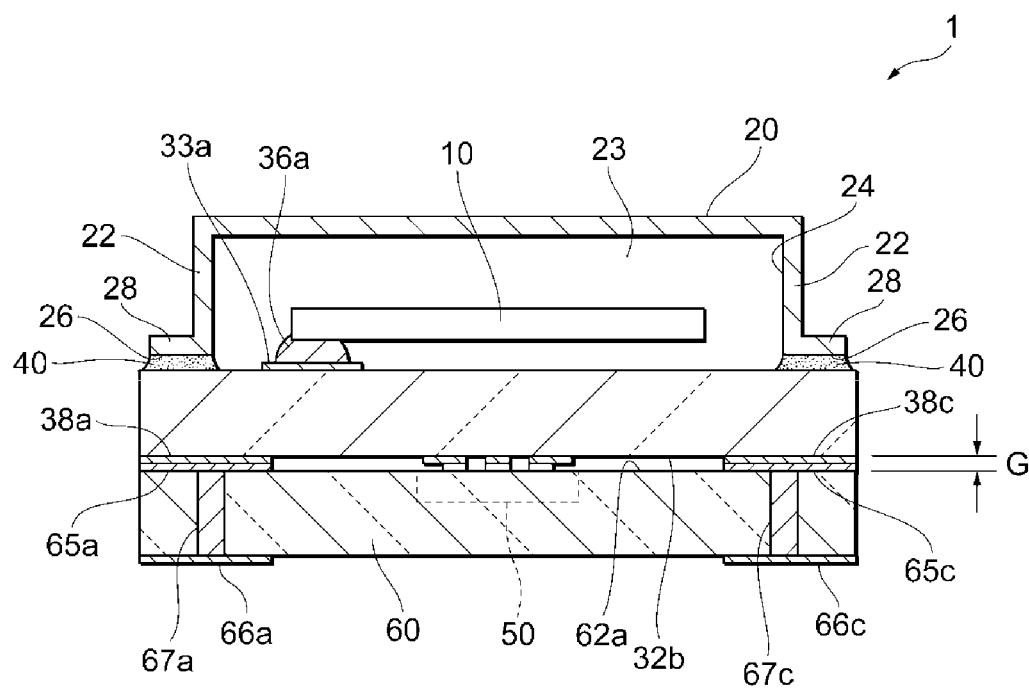
FIG. 3 is a sectional view taken along line III-III of FIG. 1.

Referring to FIGS. 1 to 3, a piezoelectric oscillator according to an exemplary embodiment will be described. FIG. 1 is an exploded perspective view of the piezoelectric oscillator, FIG. 2 is a sectional view taken along line II-II of FIG. 1, and FIG. 3 is a sectional view taken along line III-III of FIG. 1. In FIGS. 2 and 3, electrodes of the piezoelectric resonator are not illustrated.

As illustrated in FIG. 1, a piezoelectric oscillator 1 according to the present embodiment includes a piezoelectric resonator 10, a cap 20, which is an example of a lid member; a substrate 30, which is an example of a base member; an integrated circuit element 50, which is an example of an electronic component; and a mounting frame 60. The cap 20 and the substrate 30 serve as a holder that holds the piezoelectric resonator 10. A case or a package having a sealed space for accommodating the piezoelectric resonator 10 is formed by joining the cap 20 to the substrate 30 via a joining material 40 (described below).

The piezoelectric resonator 10 includes a piezoelectric substrate 11, and first and second excitation electrodes 14a and 14b formed on the piezoelectric substrate 11. The first excitation electrode 14a is formed on a first surface 12a, which is a main surface, of the piezoelectric substrate 11. The second excitation electrode 14b is formed on a second surface 12b, which is a main surface of the piezoelectric substrate 11 opposite to the first surface 12a.

The piezoelectric substrate 11 is made of a piezoelectric material, and the material is not particularly limited. In the example illustrated in FIG. 1, the piezoelectric substrate 11 is an AT-cut quartz crystal element. An AT-cut quartz crystal element is cut so that, when an X-axis, a Y-axis, and a Z-axis are the crystal axes of a synthetic quartz crystal and a Y'-axis and a Z'-axis are respectively axes that are obtained by rotating the Y-axis and the Z-axis around the X-axis by 35 degrees 15 minutes±1 degree 30 minutes in a direction from the Y-axis toward the Z-axis, the quartz crystal element has a main surface that is parallel to a plane defined by the X-axis and the Z'-axis (hereinafter, referred to as "XZ'-plane", and the same applies to planes defined by other axes). In the example illustrated in FIG. 1, the piezoelectric substrate 11, which is an AT-cut quartz crystal element, has a long-side direction parallel to the Z'-axis, a short-side direction parallel to the X-axis, and a thickness direction parallel to the Y'-axis. The piezoelectric substrate 11 has a rectangular shape when the XZ'-plane is seen in plan view. A quartz crystal resonator using an AT-cut quartz crystal element has high frequency stability in a wide temperature range, has high durability, and can be manufactured at low cost. A vibration in a thickness sheer mode is used as a main vibration of an AT-cut quartz crystal resonator.

It is noted that the piezoelectric substrate according to the present embodiment is not limited to the one described above. For example, the piezoelectric substrate may be an AT-cut quartz crystal element having a long-side direction parallel to the X-axis and a short-side direction parallel to the Z'-axis. Alternatively, the piezoelectric substrate may be a quartz crystal element that is not an AT-cut quartz crystal element (such as a BT-cut quartz crystal element) or may be made of another piezoelectric material, such as a ceramic other than quartz crystal.

As shown, the first excitation electrode 14a is formed on the first surface 12a (a surface parallel to the XZ'-plane and on the positive Y' side) of the piezoelectric substrate 11. Moreover, the second excitation electrode 14b is formed on the second surface 12b (a surface parallel to the XZ'-plane and on the negative Y' side) of the piezoelectric substrate 11, which is opposite to the first surface 12a of the piezoelectric substrate 11. The first and second excitation electrodes 14a and 14b are a pair of electrodes that substantially completely overlap each other in the XZ'-plane. Each of the excitation electrodes 14a and 14b is, for example, rectangular in the XZ'-plane. In this case, the excitation electrodes 14a and 14b are disposed so that, for example, the long-side direction thereof coincides with the long-side direction of the piezoelectric substrate 11.

A connection electrode 16a and a connection electrode 16b are formed on the piezoelectric substrate 11. The connection electrode 16a is electrically connected to the first excitation electrode 14a via an extension electrode 15a, and the connection electrode 16b is electrically connected to the second excitation electrode 14b via an extension electrode 15b. In particular, the extension electrode 15a extends on the first surface 12a from the first excitation electrode 14a toward a short side on the negative Z' side, passes along a side surface of the piezoelectric substrate 11 on the negative Z' side, and is connected to the connection electrode 16a formed on the second surface 12b. The extension electrode 15b extends on the second surface 12b from the second excitation electrode 14b toward the short side on the negative Z' side, and is connected to the connection electrode 16b formed on the second surface 12b. The connection electrodes 16a and 16b are disposed along the short side on the negative Z' side. The connection electrodes 16a and 16b are electrically connected to and mechanically held by the substrate 30 via electroconductive holding members 36a and 36b (described below). In the present embodiment, the dispositions and the patterns of the connection electrodes 16a and 16b and the extension electrodes 15a and 15b are not particularly limited as shown, and may be modified in consideration of electrical connection with other members.

In an exemplary aspect, the electrodes described above, including the first and second excitation electrodes 14a and 14b, may each include a chrome (Cr) underlying layer and a gold (Au) layer formed on the surface of the chrome layer. However, the materials of these electrodes are not particularly limited.

As illustrated in FIG. 2, the cap 20 includes a recessed portion 24 that has an opening that faces a first surface 32a of the substrate 30. A side wall portion 22 stands on the bottom surface of the recessed portion 24 so as to surround the entire periphery of the opening of the recessed portion 24. The cap 20 has a facing surface 26, which faces the first surface 32a of the substrate 30, at the edge of the opening of the recessed portion 24. The cap 20 may include a flange portion 28 that protrudes from the side wall portion 22 outward from the opening. In this case, the flange portion 28 has the facing surface 26. Thus, by joining the flange portion 28 and the substrate 30, it is possible to increase the joint area between the flange portion 28 and the substrate 30. Therefore, it is possible to increase the joint strength between the flange portion 28 and the substrate 30.

In the present embodiment, the shape of the cap 20 is not particularly limited as shown. For example, the flange portion 28 may be omitted, and an end portion of the side wall portion 22, which substantially perpendicularly stands on the bottom surface of the recessed portion 24, may be joined to the substrate 30.

The material of the cap 20, which is not particularly limited, may be an electroconductive material, such as a metal. In this case, by electrically connecting the cap 20 to a ground potential, it is possible to additionally provide a shielding function to the cap 20. Alternatively, the cap 20 may be made of an insulating material or may have a composite structure composed of an electroconductive material and an insulating material.

Moreover, the piezoelectric resonator 10 is mounted on the first surface 32a (upper surface) of the substrate 30. In the example illustrated in FIG. 1, the substrate 30 has a long-side direction parallel to the Z'-axis, a short-side direction parallel to the X-axis, and a thickness direction parallel to the Y'-axis. The substrate 30 is rectangular in the XZ'-plane. The substrate 30 may be made of, for example, an insulating ceramic. Alternatively, the substrate 30 may be made of a glass material (such as a material mainly composed of a silicate glass, or a material that is mainly composed of a substance other than silicate glass and that exhibits a glass transition due to increase in temperature), a quartz crystal material (such as an AT-cut quartz crystal), or a glass epoxy resin. The substrate 30 may be a single-layer substrate or a multi-layer substrate. When the substrate 30 is a multi-layer substrate, the substrate 30 may include an insulating layer formed as an uppermost layer of the first surface 32a. The substrate 30 may have a flat-plate-like shape or may have a recessed shape that is open toward the cap 20. As illustrated in FIG. 2, when the cap 20 and the substrate 30 are joined to each other via the joining material 40, the piezoelectric resonator 10 is hermetically sealed in an inner space (cavity) 23 surrounded by the recessed portion 24 of the cap 20 and the substrate 30.

The joining material 40 surrounds the entire periphery of each of the cap 20 and the substrate 30. The joining material 40 is interposed between the facing surface 26 of the side wall portion 22 of the cap 20 and the first surface 32a of the substrate 30. The joining material 40 may be made of an insulating material. Examples of the insulating material include a glass material (such as a low-melting glass) and a resin material (such as an epoxy resin). The cost of such an insulating material is lower than that of a metal joint. Moreover, with the insulating material, the heating temperature can be reduced and the manufacturing process can be simplified. In the case of additionally providing a shielding function to the cap 20, the cap 20 may be joined to the substrate 30 via the joining material 40 while maintaining electrical connection to the cap 20.

In the example illustrated in FIG. 2, one end of the piezoelectric resonator 10 (an end adjacent to the electroconductive holding members 36a and 36b) is a fixed end, and the other end of the piezoelectric resonator 10 is a free end. As a modification, the piezoelectric resonator 10 may be fixed to the substrate 30 at both ends thereof in the long-side direction.

As illustrated in FIG. 1, the substrate 30 includes connection electrodes 33a and 33b formed on the first surface 32a, extension electrodes 34a and 34b extending from the connection electrodes 33a and 33b toward an outer edge of the first surface 32a, outer electrodes 35a and 35b connected to the extension electrodes 34a and 34b, and mount electrodes 38a and 38b connected to the outer electrodes 35a and 35b and formed on a second surface 32b. The connection electrodes 33a and 34b are disposed inside of the outer edge of the substrate 30 so that the piezoelectric resonator 10 can be disposed at substantially the center of the first surface 32a of the substrate 30.

The connection electrode 16a of the piezoelectric resonator 10 is connected to the connection electrode 33a via the electroconductive holding member 36a. The connection electrode 16b of the piezoelectric resonator 10 is connected to the connection electrode 33b via the electroconductive holding member 36b. The electroconductive holding members 36a and 36b are made by, for example, thermally curing an electroconductive adhesive.

As shown in the exemplary aspect, the extension electrode 34a extends from the connection electrode 33a toward one of the corners of the substrate 30. The extension electrode 34b extends from the connection electrode 33b toward another corner of the substrate 30. A plurality of outer electrodes 35a, 35b, 35c, and 35d are formed at the corners of the substrate 30. Mount electrodes 38a, 38b, 38c, and 38d, which are respectively connected to the outer electrodes 35a, 35b, 35c, and 35d, are formed on the second surface 32b of the substrate 30. (The mount electrodes 38a and 38c are illustrated in FIG. 3, while the mount electrodes 38b and 38d are not illustrated the figures.) In the example illustrated in FIG. 1, the extension electrode 34a is connected to the outer electrode 35a, which is formed at the corner in the negative X-direction and negative Z'-direction; and the extension electrode 34b is connected to the outer electrode 35b, which is formed at the corner in the positive X-direction and positive Z'-direction. As illustrated in FIG. 1, the outer electrodes 35c and 35d may be formed at the remaining corners. Preferably, the outer electrodes 35c and 35*d* may be dummy electrodes that are not electrically connected to the piezoelectric resonator 10. By forming such dummy electrodes, an electroconductive material for forming the outer electrodes can be easily applied. Moreover, because the outer electrodes can be formed at all corners, a step of electrically connecting the piezoelectric vibrator to another component can be easily performed. The dummy electrodes may be connected to terminals that are disposed on a circuit board on which the piezoelectric oscillator is mounted and that are not electrically connected to any of other electronic elements mounted on a mount board. The outer electrodes 35*c* and 35*d*, which are dummy electrodes, may be ground electrodes to which a ground potential is suppled. When the cap 20 is made of an electroconductive material, it is possible to additionally provide a shielding function to the cap 20 by connecting the cap 20 to the outer electrodes 35*c* and 35*d* that are ground electrodes.

In the example illustrated in FIG. 1, each of the corners of the substrate 30 has a cutout side surface that is formed by partially cutting out the corner in a cylindrically-curved shape (also referred to as a castellation shape). The outer electrodes 35*a* to 35*d* are formed so as to be continuous with the cutout side surfaces and the second surface 32*b*. The shape of each of the corners of the substrate 30 is not limited to this shape. Each of the corners may be cut out so as to have a planar shape, or may have a rectangular shape with four right-angled corners without being cut out, in plan view.

The structures of the connection electrodes, the extension electrodes, the outer electrodes, and the mount electrodes of the substrate 30 are not limited to the examples described above, and may be modified in various ways. For example, the connection electrodes 33*a* and 33*b* may be disposed on different sides on the first surface 32*a* of the substrate 30 by, for example, forming one of the connection electrodes 33*a* and 33*b* on the positive Z' side and forming the other on the negative Z' side. With such a structure, the piezoelectric resonator 10 is supported by the substrate 30 at both ends thereof in the long-side direction. The number of outer electrodes and the number of mount electrodes are not limited to four, and only two outer electrodes and two mount electrodes may be disposed at opposite corners. The outer electrodes need not be disposed at the corners, and may be formed on one of the side surfaces of the substrate 30 excluding the corners. In this case, cutout side surfaces may be formed by partially cutting out the side surfaces so as to form cylindrically-curved surfaces as described above, and the outer electrodes may be formed on the side surfaces excluding the corners. The other outer electrodes 35*c* and 35*d*, which are dummy electrodes, and the mount electrodes 38*c* and 38*d* need not be formed. Through-holes may be formed in the substrate 30 so as to extend from the first surface 32*a* to the second surface 32*b*, and connection electrodes formed on the first surface 32*a* may be electrically connected to the second surface 32*b* through the through-holes.

According to the exemplary aspect, the integrated circuit element 50 is mounted on the second surface 32*b* of the substrate 30. As further shown, the integrated circuit element 50 has a rectangular shape, and a plurality of electrodes 52 are formed on one surface thereof (an integrated circuit surface). The plurality of electrodes 52 are electrically connected to electrodes of the substrate 30 or electrodes of the mounting frame 60. The integrated circuit element 50, the piezoelectric resonator 10, and external circuits exchange signals with each other. In the example illustrated in FIG. 2, the integrated circuit element 50 is mounted in an orientation such that the surface on which the plurality of electrodes 52 are formed faces the second surface 32*b* of the substrate 30.

In one aspect, a predetermined circuit for performing a predetermined operation is formed on the integrated circuit surface of the integrated circuit element 50. For example, the integrated circuit element 50 includes an oscillation circuit for generating a reference signal such as a clock signal, a temperature sensor circuit for detecting the temperature of the piezoelectric resonator 10, and a control circuit for controlling the vibration characteristics, the temperature, and the like of the piezoelectric resonator 10. In this case, for example, the control circuit can control the temperature of the piezoelectric resonator 10 and the vibration characteristics of the piezoelectric resonator 10 on the basis of the temperature of the piezoelectric resonator 10 detected by the temperature sensor circuit.

In the present embodiment, the electronic component is not limited to the integrated circuit element 50 and may be another electronic component (which is not limited to an active element and may be a passive element) according to alternative aspects. Moreover, a plurality of electronic components (such as the integrated circuit element 50 and one or more other electronic components) may be mounted on the second surface 32*b* of the substrate 30. Circuits included in the integrated circuit element 50 may be formed as discrete electronic components, and the discrete electronic components may be mounted on the second surface 32*b* of the substrate 30.

The mounting frame 60 is joined to the second surface 32*b* of the substrate 30 so as to surround the integrated circuit element 50. To be specific, the mounting frame 60 has a frame-like shape having an inner-peripheral side surface 63 and an outer-peripheral side surface 64. The mounting frame 60 is joined to the substrate 30 so that the integrated circuit element 50 is disposed in an opening 68 surrounded by the inner-peripheral side surface 63. The mounting frame 60 has a first surface 62*a*, which faces the second surface 32*b* of the substrate 30, and a second surface 62*b* opposite to the first surface 62*a*.

Connection electrodes 65*a*, 65*b*, 65*c*, and 65*d* are formed at the corners of the first surface 62*a* of the mounting frame 60 (a surface facing the second surface 32*b* of the substrate 30). Outer electrodes 66*a*, 66*b*, 66*c*, and 66*d* are formed at the corners of the second surface 62*b* of the mounting frame 60. As illustrated in FIG. 3, the connection electrodes 65*a* to 65*d* are electrically connected to the outer electrodes 35*a* to 35*d* and the mount electrodes 38*a* to 38*d* of the substrate 30. The connection electrodes 65*a* to 65*d* and the outer electrodes 66*a* to 66*d* respectively form pairs at the corresponding corners, and are electrically connected to each other by through-vias 67*a*, 67*b*, 67*c*, and 67*d*, which extend through the mounting frame 60 from the first surface 62*a* to the second surface 62*b*.

In the example illustrated in FIGS. 2 and 3, a gap G is formed between the second surface 32*b* of the substrate 30 and the first surface 62*a* of the mounting frame 60. The gap G is formed, for example, because the mount electrodes 38*a* to 38*d*, which are electrically connected to the outer electrodes 35*a* to 35*d* of the substrate 30, protrude from the second surface 32*b* with a predetermined thickness and/or because the connection electrodes 65*a* to 65*d* of the mounting frame 60 protrude from the first surface 62*a* with a predetermined thickness. In this case, the gap G has a thickness corresponding to the protruding thickness of each of the electrodes. In the XZ'-plane, the gap G is disposed in regions between the corners where these electrodes are formed. By forming the gap G, in the XZ'-plane, the opening 68 of the mounting frame 60 is spatially connected to the outside of the piezoelectric oscillator 1. Therefore, compared with a case where the gap G is not formed, heat can be effectively dissipated from the integrated circuit element 50 to the outside. Preferably, the height of the gap G (distance in the Y'-axis direction) may be appropriately set in consideration of the amount of heat that is generated by the integrated circuit element 50.

In the example illustrated in FIG. 1, the outer edge of the mounting frame 60 (the outermost edge of the frame) has a rectangular shape so as to correspond to the outer edge of the substrate 30 in the XZ'-plane. As with the substrate 30, each of the corners of the mounting frame 60 may have a cutout side surface that is formed by partially cutting out the corner in a cylindrically-curved shape. The mounting frame 60 is made of, for example, an insulating ceramic, a glass material, a quartz crystal material, or a glass-epoxy resin. In one aspect, the mounting frame 60 may be made of the same material as the substrate 30.

The structures of the electrodes formed on the mounting frame 60 are not limited to those described in the above examples. For example, the substrate 30 and a circuit board (described below) may be electrically connected to each other by forming electrodes on the cutout side surfaces at the corners.

With the piezoelectric oscillator 1 illustrated in FIG. 1, by applying an alternating-current voltage between the pair of first and second excitation electrodes 14a and 14b of the piezoelectric resonator 10 via the outer electrodes 66a and 66b of the mounting frame 60, the piezoelectric substrate 11 vibrates in a predetermined vibration mode, such as a thickness shear mode, and oscillation characteristics due to the vibration can be obtained.

Figure 4:
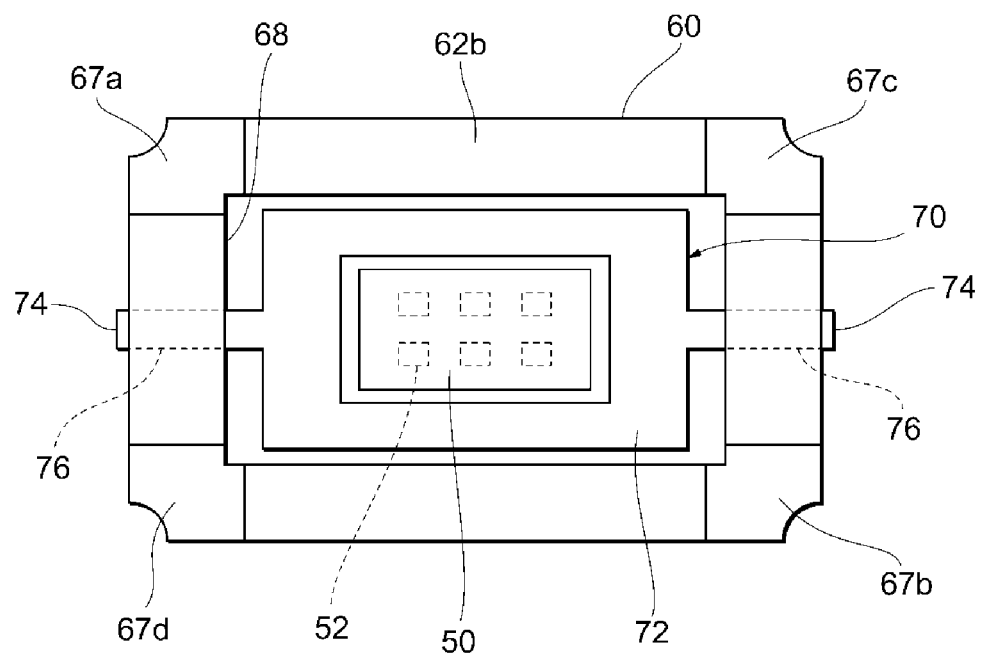
FIG. 4 is a plan view of the piezoelectric oscillator according to the exemplary embodiment.

In the present embodiment, as illustrated in FIGS. 2 and 4, a heat conduction path 70 is formed on at least one of the substrate 30 and the mounting frame 60. FIG. 4 is a plan view of the piezoelectric oscillator 1 as seen from the second surface 62b side of the mounting frame 60.

The heat conduction path 70 is made of a material having higher heat conductivity than the materials of the substrate 30 and the mounting frame 60, and, therefore, configured to conduct heat. For example, the heat conduction path 70 can be made of a metal material. The heat conduction path 70 is electrically isolated from any of the first and second excitation electrodes 14a and 14b of the piezoelectric resonator 10 and the electrodes 52 of the integrated circuit element 50 in the piezoelectric oscillator 1. To be specific, the heat conduction path 70 does not have connection portions that are electrically connected to the first and second excitation electrodes 14a and 14b of the piezoelectric resonator 10 in the piezoelectric oscillator 1, and does not have connection portions that are electrically connected to the electrodes 52 of the integrated circuit element 50 in the piezoelectric oscillator 1. In this case, the heat conduction path 70 may be electrically connected, for example, to an electrode pattern that is electrically connected to the integrated circuit element 50 on a circuit board that is a region excluding the piezoelectric oscillator 1. The heat conduction path 70 may be made of, for example, a metal that is that same as any of the metal materials of some of electrodes of the substrate 30 and the mounting frame 60, or may be made of a material having higher heat conductivity than the metals. The heat conduction path 70 is, for example, a heat conduction pattern (metal pattern) that conducts heat to the outside as described herein.

In the example illustrated in FIGS. 2 and 4, the heat conduction path 70 includes a first heat conduction portion 72, which is disposed inside of a portion (the opening 68) where the substrate 30 and the mounting frame 60 overlap each other, and second heat conduction portions 74, which are disposed outside of the portion where the substrate 30 and the mounting frame 60 overlap each other. The first and second heat conduction portions 72 and 74 are thermally and electrically connected to each other via connection portions 76. Thus, heat that is generated by the integrated circuit element 50 can advantageously be dissipated to the outside via the heat conduction path 70.

The first heat conduction portion 72 is formed in a region on the second surface 32b of the substrate 30 in which the opening 68 of the mounting frame 60 is open. In this case, the first heat conduction portion 72 is formed around the integrated circuit element 50 mounted on the second surface 32b. For example, as illustrated in FIG. 4, the first heat conduction portion 72 is integrally formed so as to surround the integrated circuit element 50. Alternatively, the first heat conduction portion 72 may be formed in a part of the periphery of the integrated circuit element 50. By forming the first heat conduction portion 72 adjacent to the integrated circuit element 50 (in particular, the integrated circuit surface), the first heat conduction portion 72 can more effectively absorb heat from the integrated circuit element 50.

The second heat conduction portions 74 are formed on the outer surface of the piezoelectric oscillator 1. In the example illustrated in FIG. 2, the second heat conduction portions 74 are formed on the outer-peripheral side surface 64 of the mounting frame 60. When the outer edge of the mounting frame 60 (the outermost edge of the frame) has a rectangular shape, the second heat conduction portions 74 can be formed adjacent to the long sides as illustrated in FIG. 4. Alternatively, the second heat conduction portions 74 may be formed adjacent to the short sides of the rectangular shape. The second heat conduction portions 74 may extend to the boundary between the outer-peripheral side surface 64 and the second surface 62b. In this case, the second heat conduction portions 74 can be easily connected to a metal pattern on a circuit board, and the second heat conduction portions 74 may further extend on the circuit board. Accordingly, the heat dissipation effect of the heat conduction path 70 can be further increased.

As illustrated in FIGS. 2 and 4, the connection portions 76 extend through portions where the second surface 32b of the substrate 30 and the first surface 62a of the mounting frame 60 overlap each other, thereby connecting the first heat conduction portion 72 and the second heat conduction portions 74. In the example illustrated in FIG. 4, the connection portions 76 are formed at a position between the outer electrode 66a and the outer electrode 66d and at a position between the outer electrode 66b and the outer electrode 66c in a portion where the second surface 32b of the substrate 30 and the first surface 62a of the mounting frame 60 overlap each other. However, the dispositions of the connection portions 76 are not particularly limited, and may be appropriately determined in accordance with the dispositions of the first and second heat conduction portions 72 and 74, which are to be connected by the connection portions 76.

As illustrated in FIG. 2, when the gap G is provided in the device, a part of the heat conduction path 70 (in FIG. 2, the connection portions 76 of the heat conduction path 70) is disposed in the gap G. In the example illustrated in FIG. 2, the thickness of the heat conduction path 70 (in the thickness direction of the device) may be smaller than the height of the gap G. In this case, compared with a case where a part of the heat conduction path 70 is embedded in the substrate 30 or the mounting frame 60, heat of the heat conduction path 70 can be easily released, and therefore the heat dissipation ability can be improved. The thickness of the heat conduction path 70 is not limited to this, and may be, for example, equal to the height of the gap G.

Moreover, the heat conduction path 70 may be a ground pattern to which a ground potential is supplied. For example, when the ground potential is supplied to one of the electrodes 52 of the integrated circuit element 50, the heat conduction path 70 may be electrically connected to the electrode 52 of the integrated circuit 50, to which ground potential is supplied, on a circuit board that is a region excluding the piezoelectric oscillator 1. A ground potential may be supplied via a circuit board (described below). By grounding the heat conduction path 70, the heat conduction path 70 can have both of a heat dissipation function and a noise suppression function. Therefore, space can be saved, compared with a case of independently forming a heat dissipation member and a noise suppression member. Both of the cap 20 and the heat conduction path 70 may be grounded by, for example, electrically connecting the heat conduction path 70 to the cap 20, which is electroconductive, via the outer electrodes 35c and 35d of the substrate 30.

With the piezoelectric oscillator according to the present embodiment, the first heat conduction portion 72, which is disposed in the space in which the integrated circuit element 50 is disposed, can absorb heat from the integrated circuit element 50, and the second heat conduction portions 74 can dissipate the heat to the outside. Therefore, heat that is generated by the integrated circuit element 50 can be easily and effectively dissipated to the outside. Accordingly, even when a temperature difference between the integrated circuit element 50 and the piezoelectric resonator 10 occurs due to heat that is generated by the integrated circuit element 50, the temperature difference can be effectively reduced.

In the example illustrated in FIG. 2, the first heat conduction portion 72 is formed on the second surface 32b of the substrate 30. As a modification, the first heat conduction portion 72 may be formed on the inner-peripheral side surface 63 of the mounting frame 60. Alternatively, the first heat conduction portion 72 may be formed on both of the second surface 32b of the substrate 30 and the inner-peripheral side surface 63 of the mounting frame 60.

In the example illustrated in FIGS. 2 and 3, the gap G is formed between the second surface 32b of the substrate 30 and the second surface 62a of the mounting frame 60. As a modification, the gap G may not be formed. For example, the mount electrodes 38a to 38d of the substrate 30 may be embedded in the second surface 32b so as to be flush with the second surface 32b; the connection electrodes 65a to 65d of the mounting frame 60 may be embedded in the first surface 62a so as to be flush with the first surface 62a; and the connection portions 76, which connect the first and second heat conduction portions 72 and 74, may be disposed at a position between the connection electrode 65a and the connection electrode 65d and a position between the connection electrode 65b and the connection electrode 65c in plan view.

Figure 5:
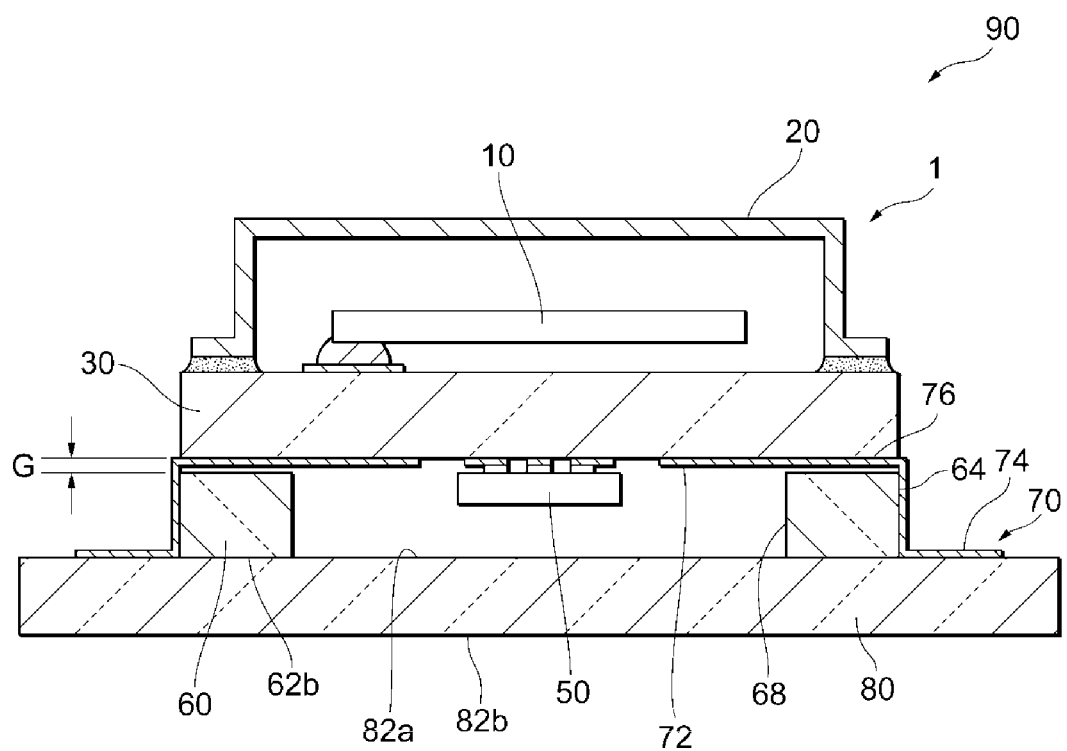
FIG. 5 is a sectional view of a piezoelectric oscillation device according to an exemplary embodiment.

Next, a piezoelectric oscillation device according to an exemplary embodiment will be described. FIG. 5 illustrates a piezoelectric oscillation device 90 according to the present embodiment. The piezoelectric oscillation device 90 includes the piezoelectric oscillator 1 described above and a circuit board 80 on which the piezoelectric oscillator 1 is mounted. The circuit board 80 has a first surface 82a and a second surface 82b. The piezoelectric oscillator 1 is mounted in such a way that the second surface 62b of the mounting frame 60 faces the first surface 82a.

Because the piezoelectric oscillation device 90 includes the heat conduction path 70 described above, heat in the space surrounded by the substrate 30, the mounting frame 60, and the circuit board 80 (the space in the opening 68) can be easily and efficiently released to the outside. The heat conduction path 70 is formed on at least one of the substrate 30, the mounting frame 60, and the circuit board 80. In the example illustrated in FIG. 5, the second heat conduction portions 74 of the heat conduction path 70 are formed outside of a portion where the substrate 30 and the mounting frame 60 overlap each other so as to extend further from the outer-peripheral side surface 64 of the mounting frame 60 to positions on the first surface 82a of the circuit board 80. That is, the second heat conduction portions 74 are formed so as to extend to a region outside of a mount region of the circuit board 80 on which the piezoelectric oscillator 1 is mounted.

With the piezoelectric oscillation device according to the present embodiment, because the piezoelectric oscillation device includes the piezoelectric oscillator 1, heat that is generated by the integrated circuit element 50 can be easily and effectively dissipated to the outside as described above.

The present invention is not limited to the embodiments described above and can be modified in various ways. In the following description, differences from the embodiments described above will be described, and elements that are the same as those described above are denoted by the same numerals in the figures.

Figure 6:
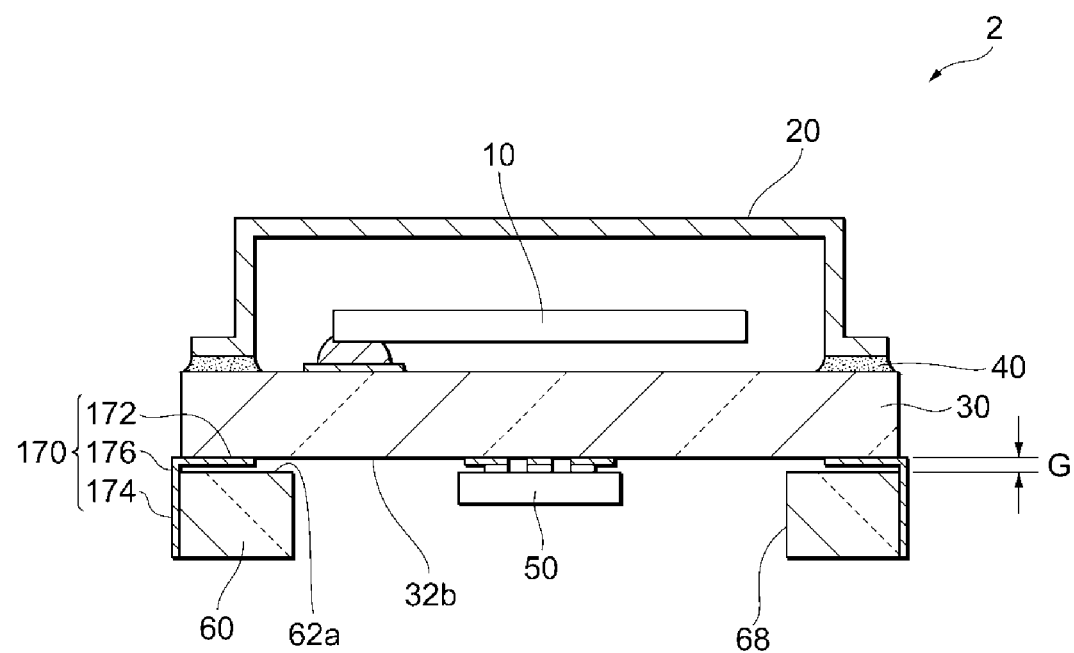
FIG. 6 is a sectional view of a piezoelectric oscillator according to a first modification of the exemplary embodiment.
Figure 7:
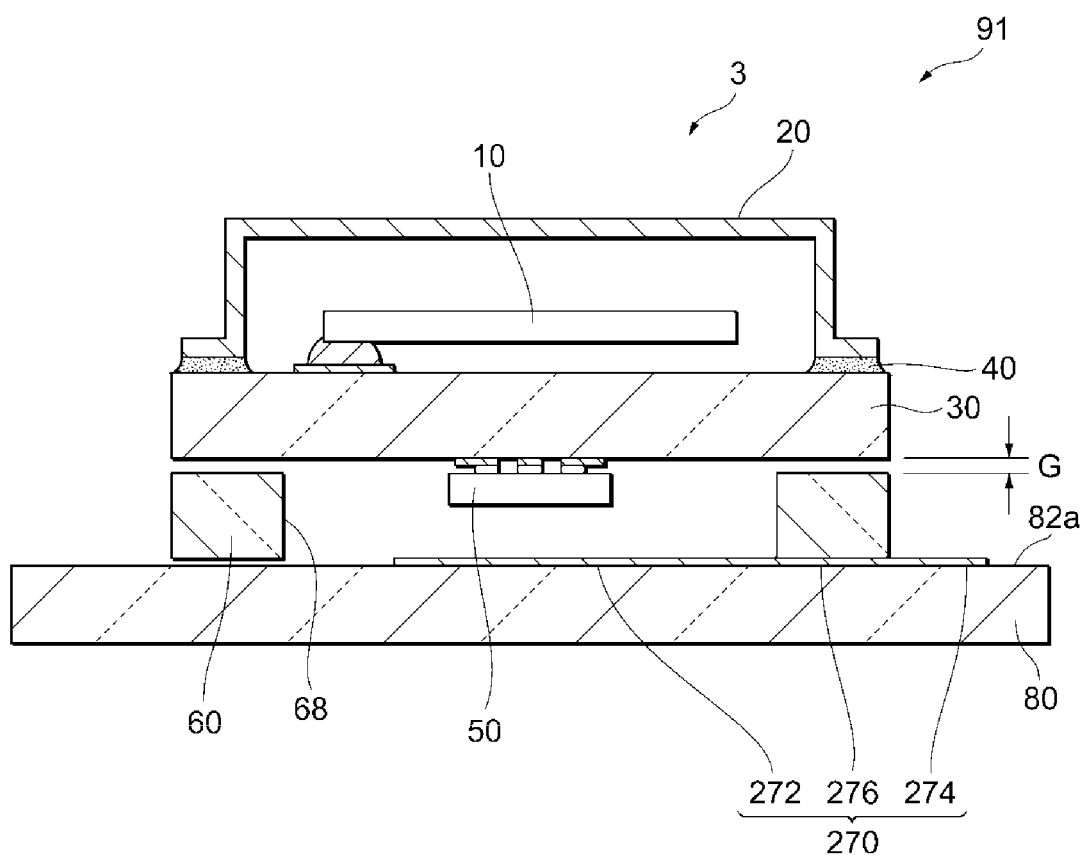
FIG. 7 is a sectional view of a piezoelectric oscillation device according to a second modification of the exemplary embodiment.
Figure 8:
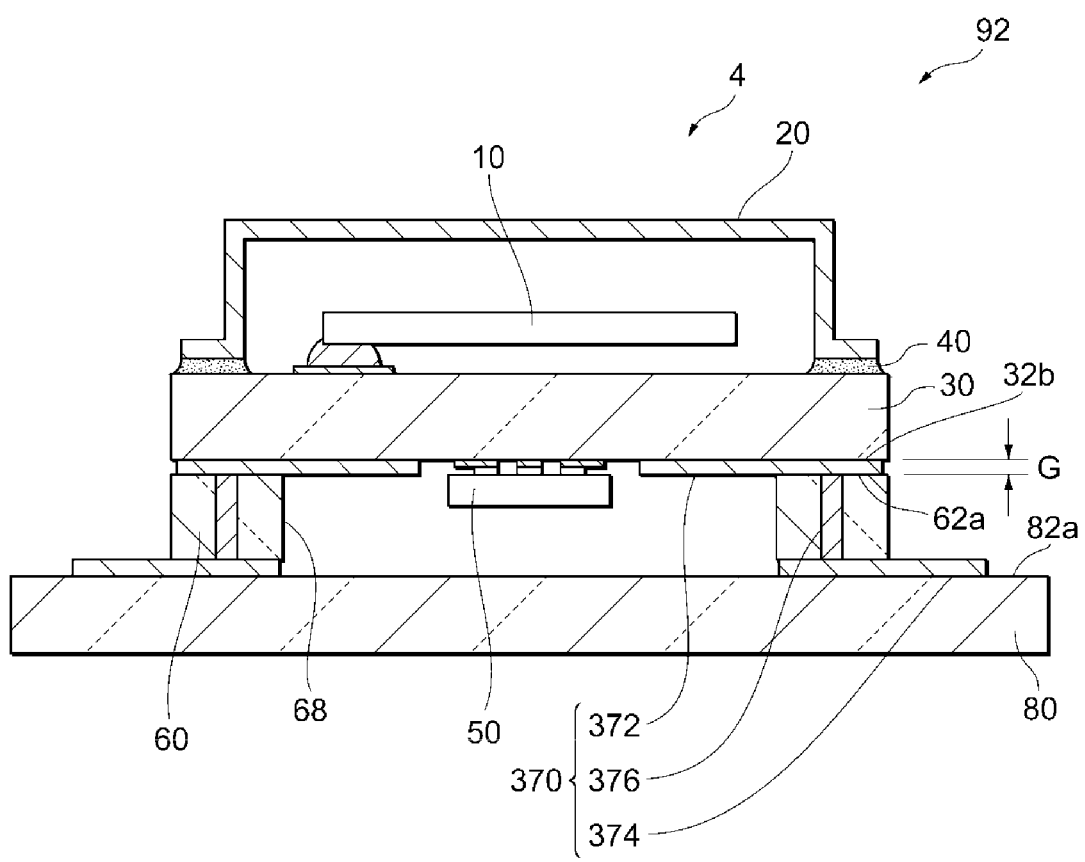
FIG. 8 is a sectional view of a piezoelectric oscillation device according to a third modification of the exemplary embodiment.

Referring to FIGS. 6 to 8, piezoelectric oscillators or piezoelectric oscillation devices according to modifications of the exemplary embodiments will be described. FIGS. 6 to 8 each illustrate the same cross section as FIG. 2. Each of the modifications described below differs from the embodiments described above in the configuration of the heat conduction path.

FIG. 6 illustrates a piezoelectric oscillator according to a first modification of the exemplary embodiments. As shown, a piezoelectric oscillator 2 includes a heat conduction path 170. The heat conduction path 170 includes a first heat conduction portion 172, which is disposed in the gap G between the second surface 32b of the substrate 30 and the first surface 62a of the mounting frame 60, and second heat conduction portions 174, which are disposed outside of the portion where the substrate 30 and the mounting frame 60 overlap each other. In the example illustrated in FIG. 6, the first heat conduction portion 172 is formed on the second surface 32b of the substrate 30 in the gap G.

With this structure, the gap G is connected to the space in the opening 68 in which the integrated circuit element 50 is disposed. Therefore, the first heat conduction portion 172, which is disposed in the gap G, can absorb heat from the integrated circuit element 50. Moreover, with the present modification, the heat conduction path 170 can be formed on a region of the second surface 32b of the substrate 30 that is not in the opening 68. Therefore, the heat dissipation ability can be improved without restricting a region for forming electrodes that are electrically connected to the integrated circuit element 50 and without reducing the degree of freedom in designing the electrode pattern.

FIG. 7 illustrates a piezoelectric oscillation device according to a second modification of the exemplary embodiments. A piezoelectric oscillation device 91 includes a piezoelectric oscillator 3 and the circuit board 80 on which the piezoelectric oscillator 3 is mounted. Except that the heat conduction path 70 is not formed, the piezoelectric oscillator 3 is the same as the piezoelectric oscillator 1 described above.

The piezoelectric oscillation device 91 includes a heat conduction path 270 that is formed on at least one of the substrate 30, the mounting frame 60, and the circuit board 80. The heat conduction path 270 includes a first heat conduction portion 272, which is disposed inside of a portion (the opening 68) where the substrate 30 and the mounting frame 60 overlap each other, and a second heat conduction portion 274, which is disposed outside of the portion where the substrate 30 and the mounting frame 60 overlap each other. In the example illustrated in FIG. 7, the first and second heat conduction portions 272 and 274 of the heat conduction path 270 and a connection portion 276 connecting the first and second heat conduction portions 272 and 274 are each formed on the first surface 82a of the circuit board 80.

Also with the present modification, the first heat conduction portion 272, which is disposed in the space in which the integrated circuit element 50 is disposed, can absorb heat from the integrated circuit element 50, and the second heat conduction portion 274 can dissipate the heat to the outside. Therefore, heat that is generated by the integrated circuit element 50 can be easily and effectively dissipated to the outside. In this case, as illustrated in FIG. 7, the first and second heat conduction portions 272 and 274 can be formed by using also the circuit board 80. Therefore, it is easy to form each of the heat conduction portions so as to have a large area, and the heat dissipation ability can be further improved.

FIG. 8 illustrates a piezoelectric oscillation device according to a third modification of the exemplary embodiments. A piezoelectric oscillation device 91 includes a piezoelectric oscillator 4 and the circuit board 80 on which the piezoelectric oscillator 4 is mounted. The piezoelectric oscillator 4 differs from the piezoelectric oscillator 1 described above in the structure of the heat conduction path. To be specific, the piezoelectric oscillation device 92 includes a heat conduction path 370. As illustrated in FIG. 8, the heat conduction path 370 includes a first heat conduction portion 372, which is disposed inside of a portion (the opening 68) where the substrate 30 and the mounting frame 60 overlap each other; second heat conduction portions 374, which are disposed outside of the portion where the substrate 30 and the mounting frame 60 overlap each other; and through-vias 376, which extend through the mounting frame 60 from the first surface 62a to the second surface 62b to electrically connect the first and second heat conduction portions 372 and 374.

As illustrated in FIG. 8, the thickness of the heat conduction path 370 may be equal to the height of the gap G. In this case, for example, the heat conduction path 370 can be formed so as to have a large thickness, and therefore the heat conductivity can be increased. In contrast to the example illustrated in FIG. 8, the thickness of the heat conduction path 370 may be smaller than the height of the gap G.

The piezoelectric oscillators or the piezoelectric oscillation devices according to the embodiments and the modifications, each of which has a corresponding one of the structures described above, can provide the following advantageous effects.

With the structure described above, the first heat conduction portion, which is disposed in a space in which the electronic component is disposed, can absorb heat from the electronic component, and the second heat conduction portion can dissipate the heat to the outside. Therefore, heat that is generated by the electronic component can be easily and effectively dissipated to the outside. Accordingly, even when a temperature difference between the electronic component and the piezoelectric resonator occurs due to heat that is generated by the electronic component, the temperature difference can be effectively reduced.

With the structure described above, the gap G is formed, and thereby the opening of the mounting frame is spatially connected to the outside of the piezoelectric oscillator. Therefore, compared with a case where the gap G is not formed, heat from the electronic component can be effectively dissipated to the outside.

With the structure described above, the first heat conduction portion, which is disposed in the gap that is connected to the space in which the electronic component is disposed, can absorb heat from the electronic component, and the second heat conduction portion can dissipate the heat to the outside. Therefore, heat that is generated by the electronic component can be easily and effectively dissipated to the outside.

With the structure described above, because the thickness of the heat conduction path is smaller than the height of the gap G, heat in the heat conduction path can be easily released, and thereby the heat dissipation ability can be further improved. If the thickness of the heat conduction path is equal to the height of the gap G, the heat conductivity of the heat conduction path can be increased.

With the structure described above, because the heat conduction path is a ground pattern to which a ground potential is supplied, spaces occupied by elements of a device or an apparatus can be reduced.

It is noted that the sizes, shapes, directions, and the like of the elements described above need not be precise, irrespective of whether or not they are modified by a word such as "about", "approximately", or "substantially", and include those that can be understood as equivalents by a person having ordinary skill in the art.

Each of the exemplary embodiments is described above in order to facilitate understating of the present invention and does not limit the scope of the present invention. The present invention can be modified/improved within the scope and sprit thereof, and the present invention includes the equivalents thereof. That is, modifications in design that are made on each of the embodiments by a person having ordinary skill in the art are included in the scope of the present invention, as long as such modifications have features of the present invention. For example, the dispositions, materials, shapes, and sizes of elements of the embodiments are not limited to those in the examples described above and may be changed as appropriate. Elements of the embodiments may be used in any combination as long as the combination is technologically feasible, and such combinations are within the scope of the present invention as long as they include the features of the present invention.

REFERENCE SIGNS LIST 1 piezoelectric oscillator
10 piezoelectric resonator
11 piezoelectric substrate
20 cap (lid member)
30 substrate (base member)
32a first surface (upper surface)
32b second surface (lower surface)
50 integrated circuit element (electronic component)
60 mounting frame
70 heat conduction path
72 first heat conduction portion 74 second heat conduction portion
80 circuit board
90 piezoelectric oscillation device

The invention claimed is:

1. A piezoelectric oscillator comprising:
a base member including an upper surface and a lower surface;
a piezoelectric resonator disposed on the upper surface of the base member;
a lid member coupled to the upper surface of the base member to hermetically seal the piezoelectric resonator;
an electronic component disposed on the lower surface of the base member;
a mounting frame coupled to the lower surface of the base member and configured to surround the electronic component;
a heat conduction path disposed on at least one of the base member and the mounting frame and configured to conduct heat; and
a gap disposed between the lower surface of the base member and a surface of the mounting frame facing the base member, with at least a part of the heat conduction path disposed in the gap,
wherein the heat conduction path is electrically isolated from both of the piezoelectric resonator and the electronic component, and
wherein the heat conduction path includes a first heat conduction portion disposed inside where the mounting frame overlaps the base member and a second heat conduction portion connected to the first heat conduction portion and disposed outside where the mounting frame overlaps the base member.

2. The piezoelectric oscillator according to claim 1, wherein the heat conduction path has a thickness in a direction orthogonal to the lower surface of the base member that is smaller than a height of the gap.

3. The piezoelectric oscillator according to claim 1, wherein the heat conduction path has a thickness in a direction orthogonal to the lower surface of the base member that is equal to a height of the gap.

4. The piezoelectric oscillator according to claim 1, wherein the heat conduction path is a ground pattern coupled to a ground potential.

5. The piezoelectric oscillator according to claim 1, wherein the piezoelectric resonator is a quartz crystal resonator.

6. The piezoelectric oscillator according to claim 1, wherein the electronic component is an integrated circuit element.

7. A piezoelectric oscillation device comprising:
the piezoelectric oscillator according to claim 1; and
a circuit board on which the piezoelectric oscillator is mounted, such that the mounting frame faces the circuit board.

8. A piezoelectric oscillator comprising:
a base member having an upper surface and a lower surface;
a piezoelectric resonator mounted on the upper surface of the base member;
an electronic component mounted on the lower surface of the base member;
a mounting frame coupled to the lower surface of the base member and surrounding the electronic component;
a heat conduction path disposed on at least one of the base member and the mounting frame and configured to conduct heat; and
a gap disposed between the lower surface of the base member and a surface of the mounting frame facing the base member,
wherein the heat conduction path includes a first heat conduction portion disposed in the gap and a second heat conduction portion connected to the first heat conduction portion and disposed outside where the base member and the mounting frame overlap each other.

9. The piezoelectric oscillator according to claim 8, further comprising a lid member that is coupled to the upper surface of the base member to hermetically seal the piezoelectric resonator.

10. The piezoelectric oscillator according to claim 8, wherein the heat conduction path is electrically isolated from both of the piezoelectric resonator and the electronic component.

11. The piezoelectric oscillator according to claim 8, wherein the heat conduction path has a thickness in a direction orthogonal to the lower surface of the base member that is smaller than a height of the gap.

12. The piezoelectric oscillator according to claim 8, wherein the heat conduction path has a thickness in a direction orthogonal to the lower surface of the base member that is equal to a height of the gap.

13. The piezoelectric oscillator according to claim 8, wherein the heat conduction path is a ground pattern coupled to a ground potential.

14. The piezoelectric oscillator according to claim 8, wherein the piezoelectric resonator is a quartz crystal resonator.

15. The piezoelectric oscillator according to claim 8, wherein the electronic component is an integrated circuit element.

16. A piezoelectric oscillation device comprising:
the piezoelectric oscillator according to claim 8; and
a circuit board on which the piezoelectric oscillator is mounted, such that the mounting frame faces the circuit board.

17. A piezoelectric oscillation device comprising:
a piezoelectric oscillator including:
a base member that has an upper surface and a lower surface,
a piezoelectric resonator mounted on the upper surface of the base member,
a lid member coupled to the upper surface of the base member to hermetically seal the piezoelectric resonator,
an electronic component mounted on the lower surface of the base member, and
a mounting frame coupled to the lower surface of the base member and configured to surround the electronic component;
a circuit board on which the piezoelectric oscillator is mounted, such that the mounting frame faces the circuit board; and
a heat conduction path disposed on at least one of the base member, the mounting frame, and the circuit board,
wherein a gap is disposed between the lower surface of the base member and a surface of the mounting frame facing the base member, with at least a part of the heat conduction path disposed in the gap,
wherein the heat conduction path is configured to conduct heat and is electrically isolated from both of the piezoelectric resonator and the electronic component, and
wherein the heat conduction path includes a first heat conduction portion disposed inside where the base member overlaps the mounting frame and a second heat conduction portion connected to the first heat conduction portion and disposed outside where the base member overlaps the mounting frame.

18. The piezoelectric oscillation device according to claim 17, wherein the heat conduction path is a ground pattern coupled to a ground potential.

* * * * *